United States Patent
Srinivasan et al.

(10) Patent No.: US 7,016,243 B1
(45) Date of Patent: *Mar. 21, 2006

(54) CONTENT ADDRESSABLE MEMORY HAVING COLUMN REDUNDANCY

(75) Inventors: Varadarajan Srinivasan, Los Altos Hills, CA (US); Bindiganavale S. Nataraj, Cupertino, CA (US); Sandeep Khanna, Santa Clara, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 10/963,473

(22) Filed: Oct. 11, 2004

Related U.S. Application Data (63) Continuation of application No. 10/775,526, filed on Feb. 9, 2004, now Pat. No. 6,804,135, which is a continuation of application No. 10/143,051, filed on May 10, 2002, now Pat. No. 6,714,430.

(51) Int. Cl.
*G11C 7/00* (2006.01)
(52) U.S. Cl. .................... 365/200; 365/189.05; 365/49
(58) Field of Classification Search ............... 365/200, 365/189.05, 189.02, 189.08, 230.08
See application file for complete search history.

(56) References Cited

U.S. PATENT DOCUMENTS

| | | | |
|---|---|---|---|
| 6,397,313 B1 * | 5/2002 | Kasa et al. ................. | 711/168 |
| 6,804,135 B1 * | 10/2004 | Srinivasan et al. ........... | 365/49 |
| 6,839,256 B1 * | 1/2005 | Proebsting et al. ........... | 365/49 |

* cited by examiner

*Primary Examiner*—Richard Elms
*Assistant Examiner*—Hien Nguyen
(74) *Attorney, Agent, or Firm*—William L Paradice, III (57) ABSTRACT

A content addressable memory (CAM) having a main array including a plurality of columns of CAM cells, a spare column of CAM cells selectable to functionally replace a defective column of CAM cells in the main array, and circuitry to shift data corresponding to the defective column and data corresponding to all subsequent columns to corresponding adjacent non-defective columns.

11 Claims, 7 Drawing Sheets

CONTENT ADDRESSABLE MEMORY HAVING COLUMN REDUNDANCY

CROSS-REFERENCE TO RELATED APPLICATION

This application is a continuation of and commonly owned U.S. patent application Ser. No. 10/775,526 entitled "Content Addressable Memory Having Column Redundancy," filed on Feb. 9, 2004 Now U.S. Pat. No. 6,804,135, which in turn is a continuation of commonly owned U.S. patent application Ser. No. 10/143,051 entitled "Content Addressable Memory Having Column Redundancy" filed on May 10, 2002 Now U.S. Pat. No. 6,714,430.

FIELD OF INVENTION

This invention relates generally to column redundancy in content addressable memory devices.

DESCRIPTION OF RELATED ART

Column redundancy has been used to improve the yield of content addressable memory (CAM) devices. In U.S. Pat. No. 5,319,589, Yamagata et al disclose a column redundancy technique for a dynamic CAM device that allows a defective column of CAM cells to be replaced with a redundant column of CAM cells. Yamagata's CAM device includes a plurality of normal bit line circuits coupled to bit line pairs of corresponding columns of CAM cells, a redundancy bit line circuit coupled to a redundant bit line pair of the redundant column of CAM cells, and a switch circuit that selectively couples input/output (I/O) line pairs to the normal and redundant bit line circuits. Each column of CAM cells includes a pair of fuses that are blown to isolate defective columns from the CAM array. Similarly, the redundant column includes a pair of fuses that are blown to enable the redundant column to replace a defective column.

Yamagata et al's CAM device requires two fuses per column to selectively enable or disable the column. The pair of fuses required for each column undesirably increases the size of the CAM array. Further, because fuses typically do not scale well with semiconductor process technologies, the increase in array size resulting from including fuses on each column is not readily remedied by migration to a smaller geometry process technology. Thus, it would be desirable to provide a column redundancy scheme for CAM devices that is more area efficient and that scales better with new process technologies.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

A method and apparatus for performing column redundancy in a CAM device is disclosed. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Additionally, logic states of various signals described herein are exemplary and therefore may be reversed or otherwise modified as generally known in the art.

The embodiments for performing column redundancy disclosed herein obviate the need for using fuses on each column in a CAM array. Thus, the CAM array can be designed and fabricated without having to accommodate for numerous fuses. This allows for an efficient use of silicon area that scales well with smaller geometry process technologies.

Figure 1:
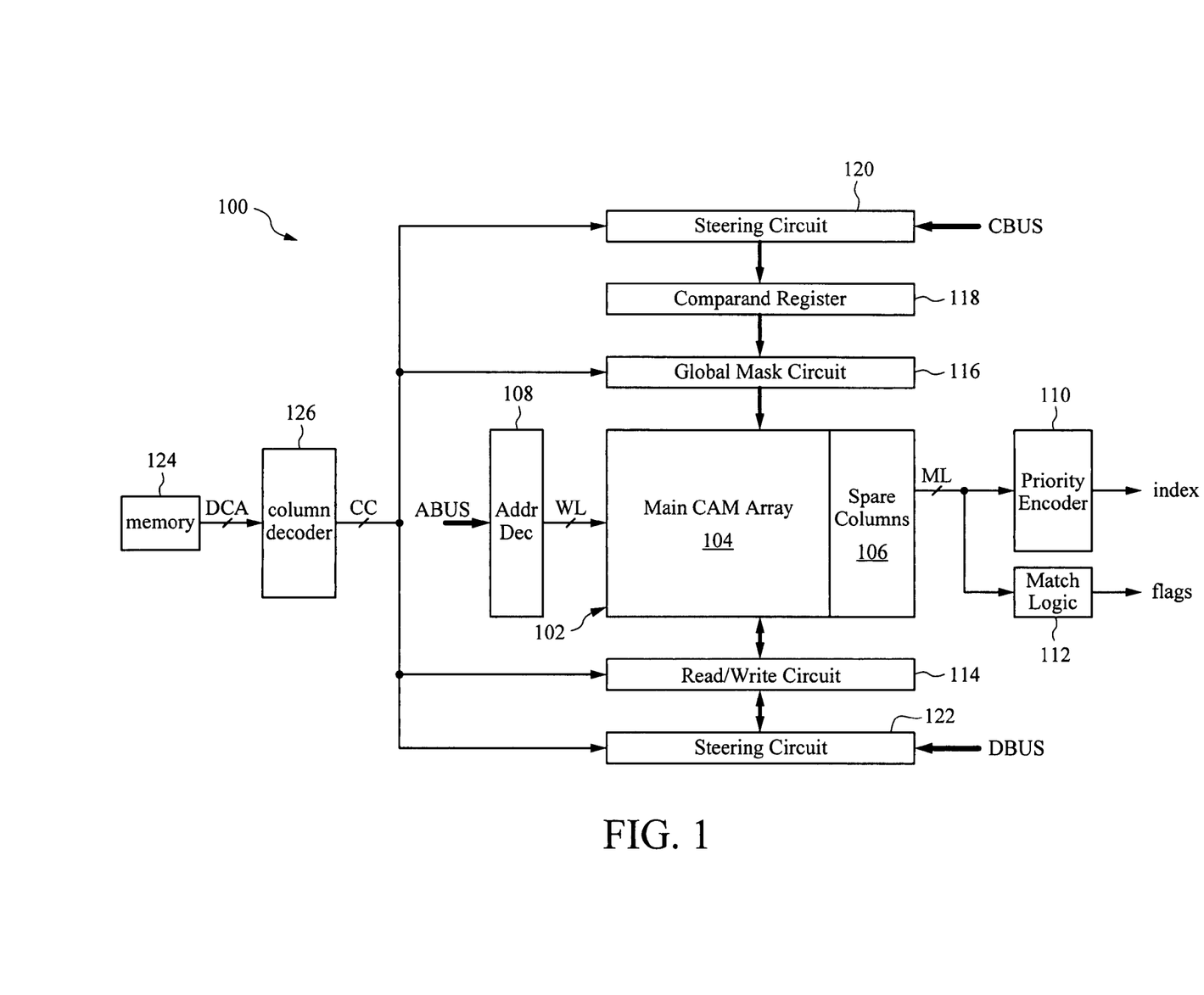
FIG. 1 is a block diagram of one embodiment of a CAM device including a main array and one or more spare columns.

FIG. 1 shows one embodiment of a CAM device 100 in accordance with the present invention. CAM device 100 includes CAM array 102 that has a main CAM array 104 and one or more spare CAM columns 106. The spare CAM columns 106 are independent columns of CAM cells that may be enabled to replace columns of CAM cells in main CAM array 104 that have one or more defective CAM cells. The CAM cells in main CAM array 104 and spare columns 106 may be any type of CAM cells, including binary or ternary CAM cells.

One or more instructions and related control signals may be provided to CAM device 100 from an instruction decoder (not shown for simplicity) to control read, write, and compare operations for CAM device 100. Other well-known signals which may be provided to CAM device 100, such as enable signals, reset signals, and clock signals, are not shown for simplicity.

Each row of CAM cells in array 102 is coupled to an address decoder 108 via a corresponding word line WL, and to a priority encoder 110 and to match logic 112 via a corresponding match line ML. For one embodiment, address decoder 108 receives addresses from an address bus ABUS. For other embodiments, address decoder 108 receives addresses from another bus. The word lines and match lines are represented collectively in FIG. 1 for simplicity. The match lines ML provide match results for compare operations to priority encoder 110, which determines the matching entry that has the highest priority number associated with it and generates the index or address of this highest priority match. Match logic 112 may generate a match flag to indicate a match condition, and may generate a multiple match flag to indicate multiple matches.

Further, although not shown in FIG. 1 for simplicity, each row of CAM cells in CAM array 102 may have one or more validity bits to indicate whether the corresponding row (or segment thereof) of CAM cells is in a valid state or an empty state. Match logic 112 may monitor the state of the validity bits and assert a full flag when all of the rows of CAM cells in CAM array 102 are filled with valid entries. The validity bits may also be provided to priority encoder 110 to generate the next free address (NFA) that is available in CAM array 102 for storing new data.

Each column of CAM cells in main array 104 and spare columns 106 is coupled to a read/write circuit 114 and to a global mask circuit 116. Global mask circuit 116 stores one or more mask patterns that mask entries in CAM array 102 for compare operations with a comparand word (e.g., search key) provided, for example, by a comparand register 118. Comparand words may be provided to comparand register 118 from a comparand bus CBUS via a steering circuit 120. For other embodiments, steering circuit 120 may provide comparand data directly to global mask circuit 116. Read/write circuit 114 includes well-known write drivers and sense amplifiers, and is coupled to a data bus DBUS via steering circuit 122.

Figure 7:
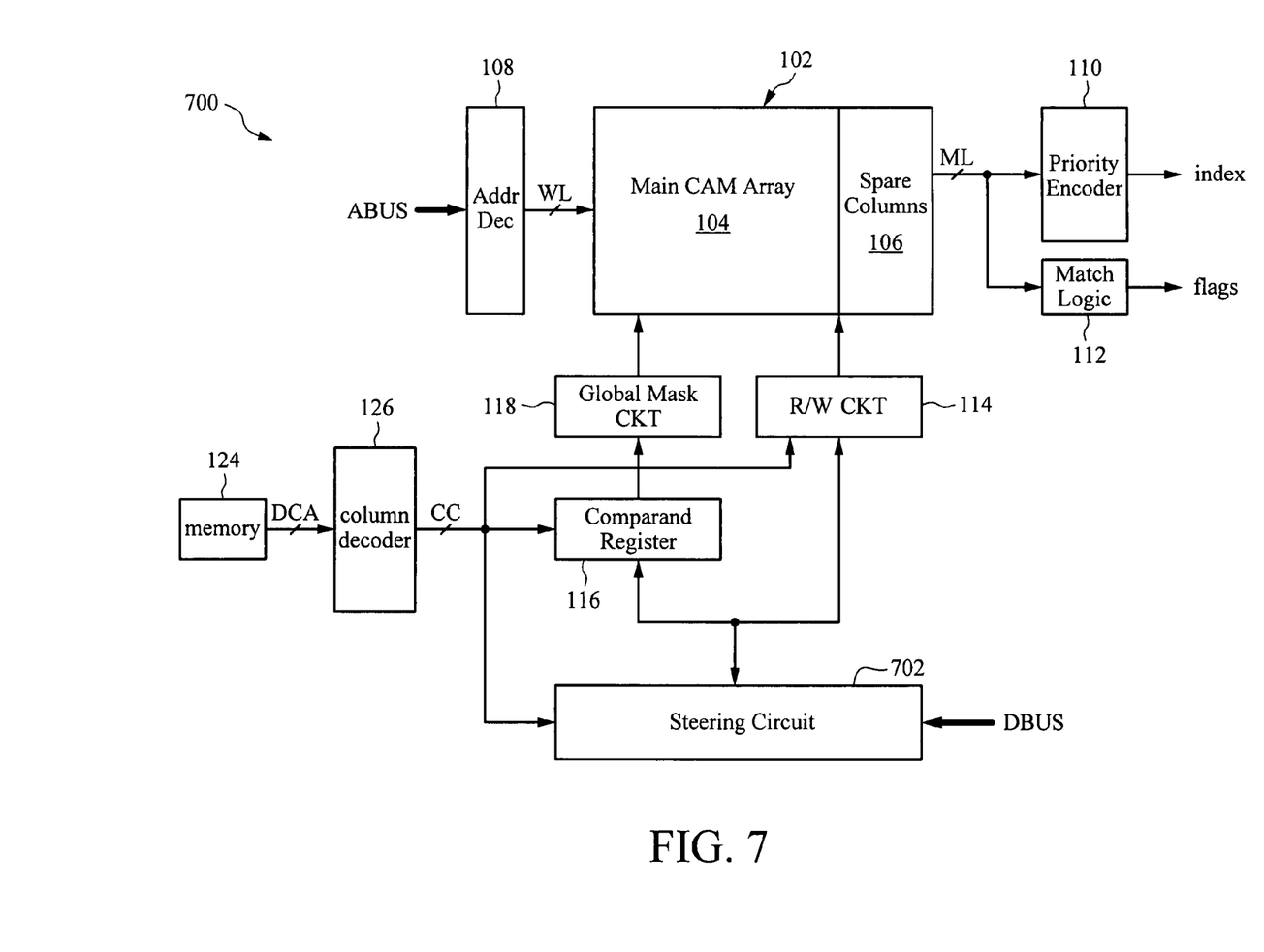
FIG. 7 is a block diagram of another embodiment of a CAM device including a main array and at least one spare column.

Steering circuits 120 and 122 may be any well-known switching logic such as, for example, a crossbar logic circuit, a switch matrix, translation logic, data filter, or mapping circuit that steers data to and from selected columns of CAM array 102 in response to one or more control signals provided, for example, by column address decoder 126. For other embodiments, steering circuits 120 and 122 are the same circuit, and CBUS and DBUS are the same bus as illustrated, for example, in FIG. 7. In the embodiment of FIG. 7, the input/output (I/O) lines of steering circuit 702 are multiplexed between read/write circuit 114 and comparand register 118 in a well-known manner.

Note that steering circuits 120 and/or 122 can also be used to steer read data, write data, and comparand data bits or groups of bits to any bit location (or removed altogether) for other than column redundancy.

Spare columns 106 may be programmed to replace defective columns of CAM cells in main CAM array 104 as follows. Initially, main CAM array 104 is tested using any generally known testing methodology and hardware to determine if any of the CAM cells in main CAM array 104 are defective. If a defective CAM cell is detected, the column address of the defective CAM cell is programmed into a memory element 124 using any suitable technique. Memory element 124 may be any suitable storage device. For one embodiment, memory element 124 includes a plurality of fuses that may be programmed with the defective column address or addresses using well-known laser techniques. For another embodiment, memory element 124 is a flash memory device. For other embodiments, memory element 124 may be eliminated, and the defective column address may be stored in a suitable external memory device and provided to CAM device 100 during initialization or reset.

When programmed, memory element 124 outputs the defective column address (DCA) to column address decoder 126, which may be any type of address decoder. Column address decoder 126 decodes DCA and provides the decoded column address as a plurality of column control (CC) signals to global mask circuit 116, to steering circuits 120 and 122, and to read/write circuit 114, where each CC signal indicates whether a corresponding column in main CAM array 104 is defective. In alternative embodiments, DCA may be stored in memory 124 fully decoded and column decoder 126 eliminated. In response to the CC signals, steering circuits 120 and 122 steer data access for the defective column of CAM cells in main CAM array 104 to spare column 106. Thus, for write operations, steering circuit 122 steers data for the defective column(s) to spare column(s) 106. For read operations, steering circuit 122 steers data received from spare column(s) 106 into the correct position of the data output onto DBUS in place of data from the corresponding defective column in the main CAM array. For compare operations, steering circuit 120 steers comparand data corresponding to the defective column(s) in main CAM array 104 to spare column(s) 106 for comparison with data stored therein. Global mask circuit 116 selectively masks the defective column in main array 104 in response to the CC signals to prevent the defective column from effectively participating in the compare operation.

Figure 2:
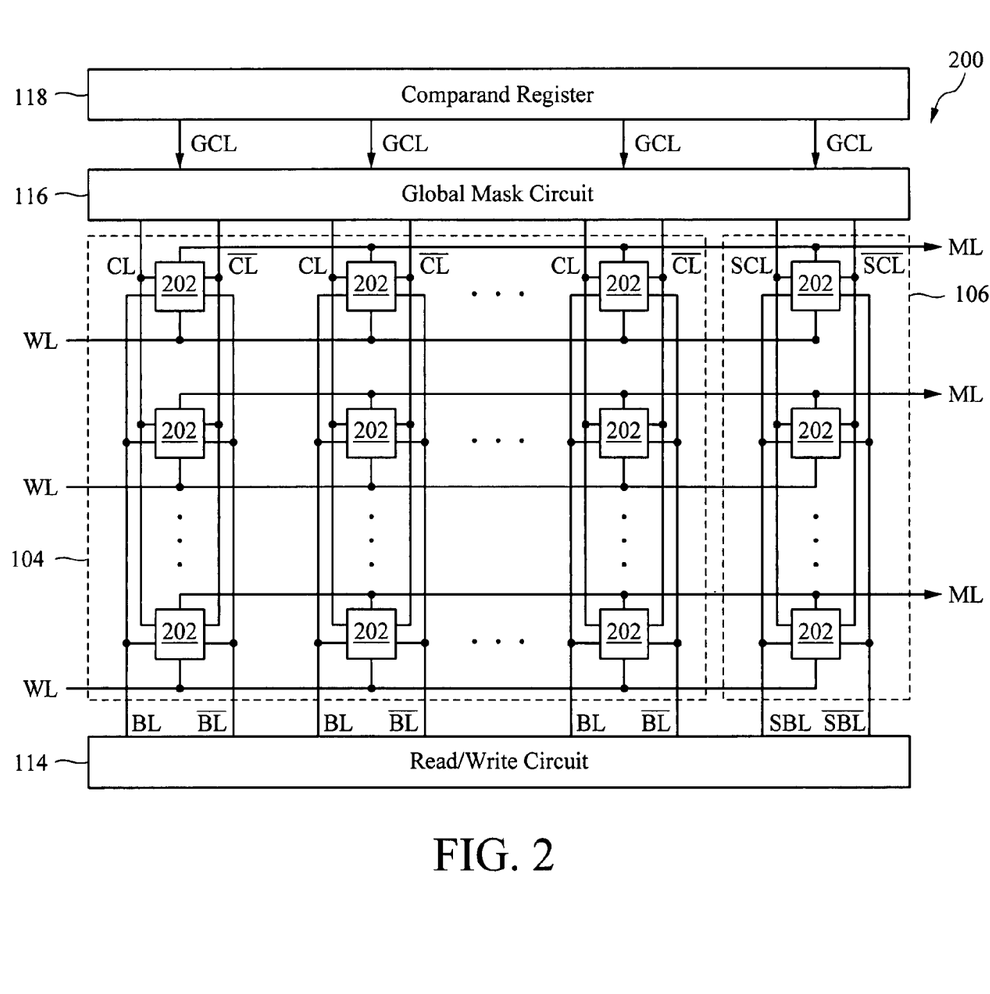
FIG. 2 is a block diagram of one embodiment of the CAM array of FIG. 1.

FIG. 2 shows a CAM array 200 that is one embodiment of CAM array 102 of FIG. 1. Array 200 includes main CAM array 104 having a plurality of CAM cells 202 organized in any number of rows and columns, and includes spare column 106 having a number of redundant CAM cells 202. CAM cells 202 are well-known, and may be any suitable binary, ternary, SRAM-based, DRAM-based, or non-volatile CAM cell. As noted above, one or more validity bits may also be included. For simplicity, only one spare column 106 is shown in FIG. 2, although in other embodiments spare column 106 may include any number of spare columns of CAM cells 202. For those embodiments having more than one spare column, each spare column has its own steering circuit, memory element 124, column decoder 126, and corresponding CC signals.

Each row of CAM cells 202 is coupled to a match line ML and to a word line WL. Each word line WL is driven by address decoder 108 (see also FIG. 1) to select one or more rows of CAM cells 202 for writing or reading. Each match line ML provides the match results of a compare operation to priority encoder 110. A match line ML indicates a match condition for the row only if all CAM cells 202 in that row match the comparand data. In some embodiments, the match line ML is pre-charged for the compare operation. If any CAM cell 202 in the row does not match the comparand data, the CAM cell(s) 202 discharges the match line ML toward ground potential (i.e., logic low). Conversely, if all CAM cells 202 match the masked comparand data, the match line ML remains in a charged (i.e., logic high) state.

Each column of CAM cells 202 in main CAM array 104 is coupled to a bit line pair BL and $\overline{BL}$ and to a comparand line pair CL and $\overline{CL}$. Spare column 106 of CAM cells 202 is coupled to a spare bit line pair SBL and $\overline{SBL}$ and to a spare comparand line pair SCL and $\overline{SCL}$. The bit line pairs BL and $\overline{BL}$ and spare bit line pair SBL and $\overline{SBL}$ are each coupled to read/write circuit 114. Read/write circuit 114 is well-known, and may include write drivers or buffers to provide data to bit line pairs BL and $\overline{BL}$ and to spare bit line pair SBL and $\overline{SBL}$ during write operations, and may include sense amplifiers to determine the logic states of bit line pairs BL and $\overline{BL}$ and spare bit line pair SBL and $\overline{SBL}$ during read operations.

The comparand line pairs CL and $\overline{CL}$ and the spare comparand line pair SCL and $\overline{SCL}$ are each coupled to global mask circuit 116, which in turn is coupled to comparand register 118 via corresponding global comparand lines GCL. For other embodiments, each global comparand line GCL may be a pair of complementary global comparand lines. Global mask circuit 116 logically combines a comparand word received from comparand register 118 via GCL with one of the mask patterns stored in global mask circuit 116 to generate a masked search key, and then drives the masked search key onto comparand line pairs CL and $\overline{CL}$ (and onto spare complementary line pair SCL and $\overline{SCL}$ if there is a defective column in main array 104) for comparison with data in CAM cells 202.

For alternate embodiments, other CAM array architectures may be used. For example, in some embodiments, CAM array 200 may not include complementary comparand lines CL and $\overline{CL}$, in which case the complementary bit lines BL and $\overline{BL}$ may be coupled to comparand register 118 via global mask circuit 116 and be used to perform a compare operation as is generally known in the art. Similarly, spare column 106 may not include complementary spare comparand lines SCL and $\overline{SCL}$, in which case the complementary spare bit lines SBL and $\overline{SBL}$ may be coupled to comparand register 118 via global mask circuit 116. Additionally, CAM array 200 is shown as a NOR-based CAM array. In alternative embodiments, other CAM arrays (e.g., NAND-based CAM arrays) may be used.

Read, write, and compare operations are more fully described below with reference to FIGS. 1 and 2. For write operations, a data word is provided to steering circuit 122 via DBUS. If there is not a defective column in main CAM array 104, steering circuit 122 passes the data word to read/write circuit 114, which in turn drives the data word onto corresponding bit line pairs BL and $\overline{BL}$. The data is written to a row of main CAM array 104 selected by address decoder 108 in a well-known manner, for example, by asserting a word line WL in response to an externally provided address, the NFA generated by priority encoder 110, or any other presented address. Because there is not a defective column in main array 104, data is not written to any of spare columns 106. Alternately, default data may be written to the spare columns.

If there is a defective column in main CAM array 104, the DCA is programmed into memory element 124. Column address decoder 126 decodes DCA to generate the CC signals. In response to the CC signals, steering circuit 122 steers data corresponding to the defective column in main array 104 to spare column 106 via read/write circuit 114, and passes data corresponding to non-defective columns to main CAM array 104 via read/write circuit 114.

For example, if the third column of main CAM array 104 contains one or more defective CAM cells, a DCA of "000010" is programmed into memory element 124 and provided to column address decoder 126. In response to DCA, column decoder 126 sets the third CC signal to an asserted state (e.g., logic high), and sets the remaining CC signals to unasserted states (e.g., logic low). The asserted state of the third CC signal causes steering circuit 122 to steer the third bit of the data word to spare column 106. Read/write circuit 114 drives the third data bit onto spare bit line pair SBL and $\overline{SBL}$ for writing to spare column 106. Steering circuit 122 passes all other data bits to corresponding non-defective columns of main CAM array 104 via read/write circuit 114. In this manner, the defective column of main CAM array 104 is mapped to spare column 106 without using fuses on each column 104 or spare column 106.

For read operations, the data word stored in a row selected by address decoder 108 is provided to read/write circuit 114, which in turn passes the data word to steering circuit 122. In response to the CC signals, steering circuit 122 re-orders the bits of the data word for output to DBUS. Thus, continuing the example above, if steering circuit 122 maps the third bit of the data word to spare column 106 during the write operation, then steering circuit 122 re-maps the data bit read from spare column 106 to the third bit position of the data word output to DBUS.

For compare operations, a comparand word is provided to steering circuit 120 via CBUS. If there is a defective column in main CAM array 104, as indicated by the defective column address programmed into memory element 124, steering circuit 120 steers the bit of the comparand word that corresponds to the defective column in main CAM array 104 to spare column 106 and passes all other bits of the comparand word to corresponding non-defective columns in main CAM array 104. Steering circuit 120 steers the comparand bits to comparand register 118, which in turn forwards the comparand word to global mask circuit 116. Global mask circuit 116 logically combines the comparand word with a mask pattern stored therein to form a masked search key, which is then driven onto the comparand line pairs CL and $\overline{CL}$ and spare comparand line pair SCL and $\overline{SCL}$. If there is a defective column in main CAM array 104, and the global mask circuit masks (e.g., in response to the CC signals) the comparand for the defective column, circuit 120 forwards the comparand word to the spare column via global mask circuit 116 and comparand register 118.

For one embodiment, the unmasked bits of the search key are driven onto corresponding comparand line pairs CL and $\overline{CL}$ and/or spare comparand lines SCL and $\overline{SCL}$ to allow for comparison with data bits stored in corresponding columns of the CAM array, while the masked bits of the search key drive corresponding comparand line pairs CL and $\overline{CL}$ and/or spare comparand line pair SCL and $\overline{SCL}$ to the same predetermined logic state (e.g., logic low) to effectively preclude participation in the compare operation. For example, for each mask bit indicating that a column or spare column in array 102 is not to be masked, global mask circuit 116 drives the comparand line pair or spare comparand line pair in response to the corresponding bit of the search key. Conversely, for each mask bit indicating that a column in array 102 is to be masked, global mask circuit 116 drives the corresponding comparand line pair or spare comparand line pair to the same predetermined state (e.g., logic low) so that CAM cells 202 coupled thereto indicates a match condition, irrespective of data stored therein.

Mask patterns stored in global mask circuit 116 may be steered into selected bit positions of global mask circuit 116 by steering circuit 120 in response to the CC signals in the manner described above for compare operations. The mask bit that corresponds to the defective column in main CAM array 104 is set to a masking state to drive the comparand line pair of the defective column to the same predetermined logic state (e.g., logic low). Thus, if there is a defective column in main CAM array 104, global masking circuit 116 masks the defective column to prevent the defective column from effectively participating in the compare operation. For one embodiment, a logic high mask bit indicates a masked condition and a logic low mask bit indicates an unmasked condition.

Figure 3:
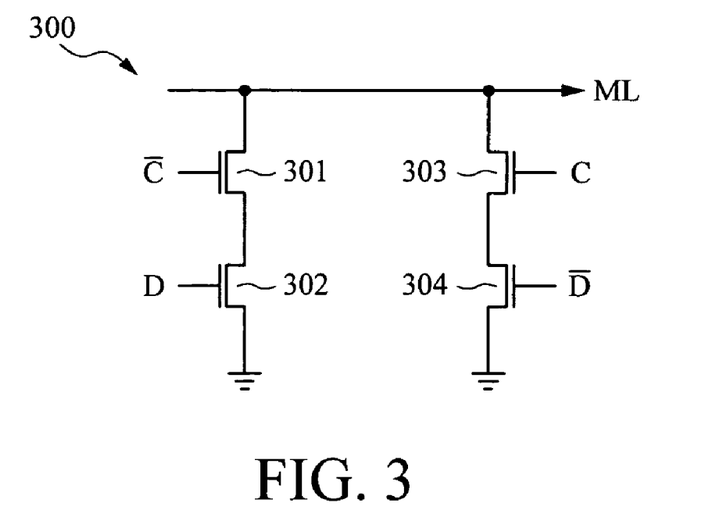
FIG. 3 is a circuit diagram of one embodiment of a compare circuit for the CAM cells of the array of FIG. 2.

FIG. 3 shows one embodiment 300 of a compare circuit for CAM cell 202 that selectively discharges match line ML in response to a comparison between a data bit D stored in the CAM cell and a corresponding comparand bit C. Compare circuit 300 includes a first discharge path including NMOS transistors 301–302 coupled in series between the match line ML and ground potential and a second discharge path including NMOS transistors 303–304 coupled in series between match line ML and ground potential. The complement of the comparand bit $\overline{C}$ is coupled to the gate of transistor 301, the data bit D is coupled to the gate of transistor 302, the comparand bit C is coupled to the gate of transistor 303, and the complement of the data bit $\overline{D}$ is coupled to the gate of transistor 304. If the comparand bit does not match the data bit, one discharge path is conductive, and match line ML discharges to ground potential to indicate the mismatch condition. Conversely, if the comparand bit matches the data bit, or if C and $\overline{C}$ are both set to logic low (e.g., in response to an asserted mask bit), both discharge paths are non-conductive, and match line ML remains in a pre-charged state (e.g., by a pre-charge circuit coupled to the match line) to indicate the match condition.

Figure 4:
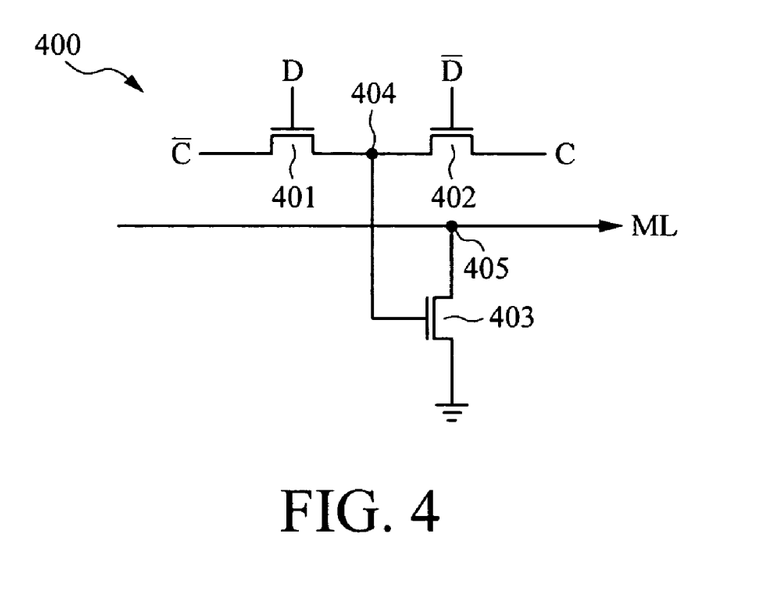
FIG. 4 is a circuit diagram of another embodiment of a compare circuit for the CAM cells of the array of FIG. 2.

FIG. 4 shows another embodiment 400 of a compare circuit for CAM cell 202. Compare circuit 400 includes NMOS transistors 401 and 402 coupled in series between the comparand bit C and its complement $\overline{C}$, with the gate of transistor 401 coupled to the data bit D and the gate of transistor 402 coupled to the complemented data bit $\overline{D}$. An NMOS discharge transistor 403 coupled between match line ML and ground potential has a gate coupled to a node 404 between series-connected transistors 401 and 402. If the comparand bit does not match the data bit, either transistor 401 (if C=0, D=1) or transistor 402 (if C=1, D=0) pulls the gate of transistor 403 to logic high and turns on transistor 403, which in turn discharges match line ML. Conversely, if the comparand bit matches the data bit, either transistor 401 (if C=1, D=1) or transistor 402 (if C=0, D=0) pulls the gate of transistor 403 to logic low to turn off transistor 403, which in turn allows match line ML to remain in a pre-charged state. If both C and $\overline{C}$ are set to logic low (e.g., in response to an asserted mask bit), transistor 403 is nonconductive and allows match line ML to remain in its pre-charged state.

Figure 5:
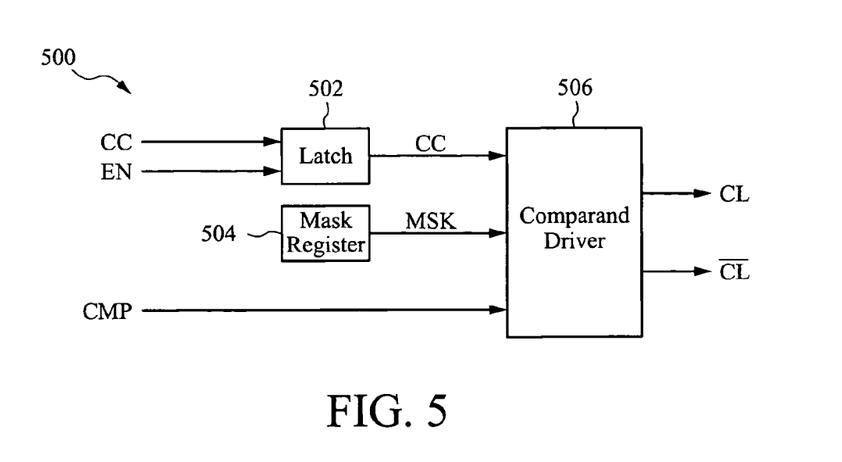
FIG. 5 is a block diagram of one embodiment of a global mask circuit in accordance with the present invention.

FIG. 5 shows a first segment 500 of one embodiment of global mask circuit 116 (see also FIG. 1) for controlling the comparand line pair CL and $\overline{CL}$ for a corresponding column of main CAM array 104. Global mask circuit 500 includes a latch 502, a mask register 504, and comparand driver 506. Latch 502 includes a data input coupled to column control signal CC and a control terminal coupled to an enable signal EN. Latch 502 may be any type of latch including, for example, a D-type flip-flop. Mask register 504 stores a mask bit MSK for the corresponding column of main CAM array 104, and may be any suitable register or memory element. Comparand driver 506 includes inputs coupled to receive CC from latch 502, MSK from mask register 504, and a corresponding comparand bit CMP from comparand register 118, and includes outputs coupled to comparand line pair CL and $\overline{CL}$.

During initialization or reset of CAM device 100 (or at another determined time), EN is asserted (e.g., to logic high) and causes CC to be latched into latch 502. Comparand driver 506 logically combines CC, MSK, and CMP to selectively drive comparand line pair CL and $\overline{CL}$. If CC is asserted to indicate that the column is defective, comparand driver 506 drives comparand line pair CL and $\overline{CL}$ to the same logic state (e.g., logic low) to prevent the column from participating in the compare operation, regardless of MSK and CMP. Conversely, if CC is not asserted, comparand driver 506 drives CL and $\overline{CL}$ in response to CMP if MSK is set to an unmasked state or drives CL and $\overline{CL}$ to the same predetermined state if MSK is asserted to a masked state. The logic function performed by comparand driver 506 is summarized in the truth table below. It is to be understood that numerous logic circuits may be used to implement the logic function illustrated in Table 1 (including alternatives that logically complement one or more of the signals), and therefore specific circuit configurations of comparand driver 506 are not provided herein so as to not obscure the invention.

TABLE 1

| CC (x) | MSK (x) | CMP (x) | CL | $\overline{CL}$ |
|---|---|---|---|---|
| 0 | 0 | 0 | 0 | 1 |
| 0 | 0 | 1 | 1 | 0 |
| 0 | 1 | 0 | 0 | 0 |
| 0 | 1 | 1 | 0 | 0 |
| 1 | 0 | 0 | 0 | 0 |
| 1 | 0 | 1 | 0 | 0 |
| 1 | 1 | 0 | 0 | 0 |
| 1 | 1 | 1 | 0 | 0 |

Figure 6:
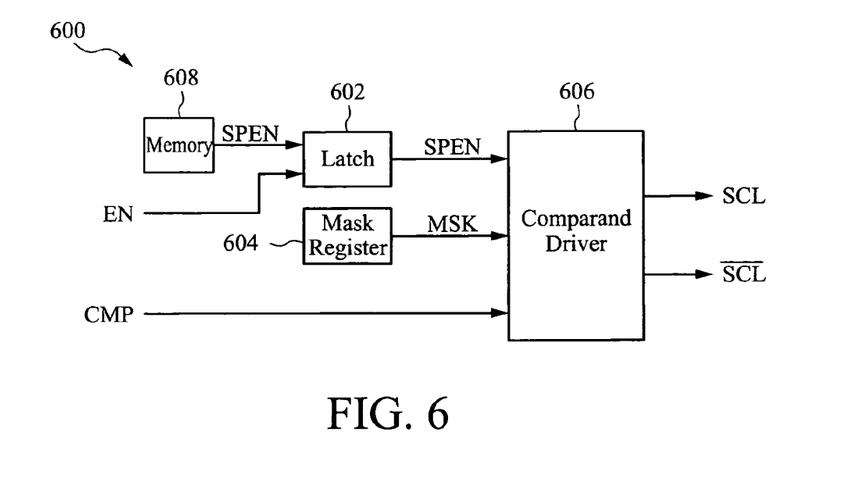
FIG. 6 is a block diagram of another embodiment of a global mask circuit in accordance with the present invention.

FIG. 6 shows a second segment 600 of one embodiment of global mask circuit 116 (see also FIG. 1) for controlling the spare comparand line pair SCL and $\overline{SCL}$ coupled to a corresponding spare column 106. Global mask circuit 600 includes a latch 602, a mask register 604, comparand driver 606, and a memory element 608. Latch 602, which may be any type of latch including, for example, a D-type flip-flop, includes a data input coupled to a spare column enable signal (SPEN) stored in memory element 608 and a control terminal coupled to EN. Memory element 608 may be any suitable memory device. For one embodiment, memory element 602 is a fuse that may be programmed either electrically or with a laser. For other embodiments, memory element 608 may be a non-volatile semiconductor memory such as, for example, flash memory. Mask register 604 stores a mask bit MSK for the spare column 106, and may be any suitable register or memory element. Comparand driver 506 includes inputs to receive SPEN from latch 602, MSK from mask register 604, and a comparand bit CMP steered from the defective column in main CAM array 104 to spare column 106 via steering circuit 120. Comparand driver 606 also includes outputs coupled to spare comparand line pair SCL and $\overline{SCL}$.

The logic state of SPEN indicates whether spare column 106 is selected to replace a defective column in main CAM array 104. During manufacture of CAM device 100, memory element 608 is initially set to an un-asserted state (e.g., SPEN=0) that disables spare column 106. If testing reveals a defective column in main CAM array 104, memory element 608 is set to an asserted state (e.g., SPEN=1) that enables spare column 106. During initialization or reset of CAM device 100 (or at another determined time), EN is asserted (e.g., to logic high) and causes SPEN to be latched into latch 602. Comparand driver 606 logically combines SPEN, MSK, and CMP to selectively drive spare comparand line pair SCL and $\overline{SCL}$. If SPEN is not asserted, comparand driver 606 drives spare comparand line pair SCL and $\overline{SCL}$ to the same logic state (e.g., logic low) to prevent spare column 106 from participating in compare operations. Conversely, if SPEN is asserted, comparand driver 606 drives SCL and $\overline{SCL}$ in response to CMP if MSK is set to an unmasked state or drives SCL and $\overline{SCL}$ to the same state if MSK is asserted to a masked state. The logic function of comparand driver 606 is the same as illustrated above in table 1, where the SPEN signal of FIG. 6 corresponds to the CC signal of FIG. 5. For some embodiments, global mask circuits 500 and 600 are the same circuit.

As mentioned above, memory elements 124 (FIG. 1) and 608 (FIG. 6) may be any suitable volatile or non-volatile storage device, including flash memory. Embodiments using flash memory for memory elements 124 and 608 allow for easier migration to smaller geometry process technologies. Further, embodiments for which memory elements 124 and 608 are flash memory allow the defective column address and SPEN, respectively, to be programmed into CAM device 100 at any time after fabrication. Thus, for example, if a column in main CAM array 104 becomes defective after a period of use by a customer, the customer may program the defective column address into CAM device 100 and set SPEN to an asserted state to functionally replace a defective column in main CAM array 104 with a spare column 106. In this manner, the customer may repair CAM device 100 long after CAM device 100 is packaged and sold to the customer. For other embodiments, CAM device 100 may include standard testing architecture such as, for example, the well-known JTAG standard, that allows for an in-system repair of CAM device 100. The ability to repair CAM device 100 after packaging and subsequent use may increase the useful life of CAM device 100 and improve its reliability. In contrast, because fuses on a semiconductor die are typically blown before the die is sorted and packaged, devices that use such fuses on the bit lines or columns to implement column redundancy cannot be readily repaired by the customer.

Figure 8:
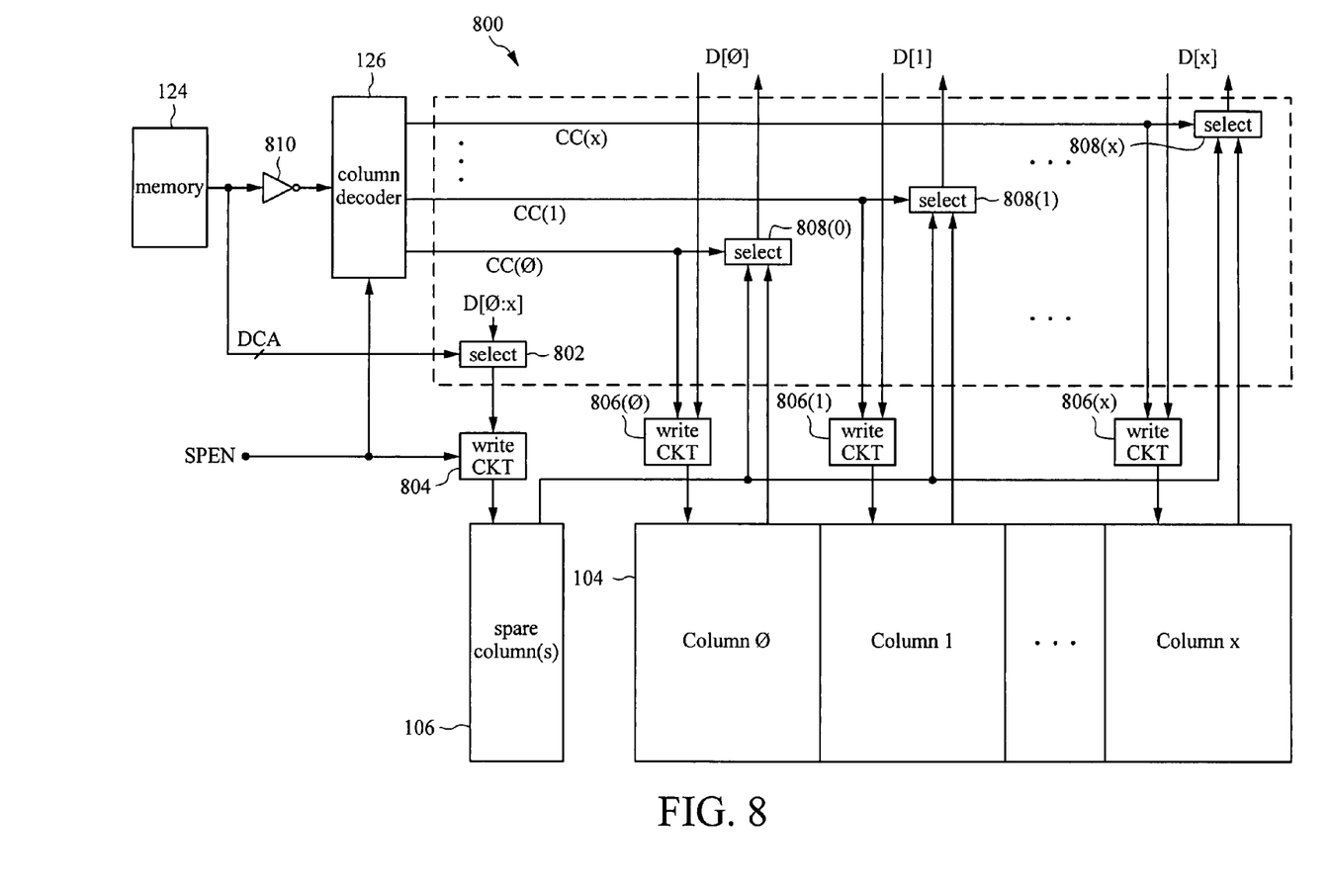
FIG. 8 is a block diagram of one embodiment of a steering circuit in accordance with the present invention.

FIG. 8 shows a steering circuit 800 that is one embodiment of steering circuits 120 and 122 of FIG. 1 and/or steering circuit 702 of FIG. 7. Steering circuit 800 includes a spare column select circuit 802 and a plurality of column select circuits 808(0)–808(x) that steer data into the CAM array in response to the CC signals. For one embodiment, spare column select circuit 802 and column select circuits 808 are multiplexers, although any suitable select logic may be used. Spare column select circuit 802 is coupled to spare column 106 via a spare column write circuit 804, and column select circuits 808(0)–808(x) are coupled to corresponding columns in main CAM array 104 via column write circuits 806(0)–806(x), respectively. Write circuits 804 and 806(0)–806(x) form part of read/write circuit 114. For one embodiment, write circuits logic 804 and 806(0)–806(x) perform a logical AND function. For simplicity, global mask circuit 116 and comparand register 118 are not shown in FIG. 8. Further, although described below as having only one spare column, spare column 106 may include any number of spare columns.

The spare column enable signal SPEN is provided to write circuit 804 and to column decoder 126. The defective column address stored in memory element 124 is provided as a control signal to spare column select circuit 802, which includes a plurality of inputs to receive data bits D(0)–D(x) from DBUS and includes an output terminal coupled to spare column 106 via write circuit 804. The defective column address is also provided to column address decoder 126 via an inverter circuit 810. Column decoder 126 decodes the logically complemented DCA to generate column control signals CC(0)–CC(x), each of which indicates whether a corresponding column in main CAM array 104 is defective. For this embodiment, a logic high state for CC indicates that the corresponding column is non-defective, and a logic low state for CC indicates that the corresponding column is defective.

Column control signals CC(0)–CC(x) are coupled to first input terminals of write circuits 806(0)–806(x), respectively, and to control terminals of column select circuits 808(0)–808(x), respectively. Each write circuit 806(0)–806(x) includes a second input coupled to receive a corresponding data bit D(0)–D(x), and includes an output coupled to a corresponding column of main CAM array 104. Each select circuit 808(0)–808(x) includes a first input coupled to a corresponding column of main CAM array 104, a second input coupled to spare column 106, and an output to provide a corresponding data bit D(0)–D(x) onto DBUS.

For write operations, a data word is provided onto DBUS as data bits D(0)–D(x) and provided to write circuits 806(0)–806(x), respectively, and to spare column select circuit 802. If there is not a defective column in main CAM array 104, SPEN is set to an un-asserted state (e.g., to logic low), which in turn disables column decoder 126 and disables spare column write circuit 804. When disabled, spare column write circuit 804 prevents data from being written to spare column 106, for example, by driving the spare bit line pair (not shown in FIG. 8 for simplicity) to the same predetermined state, and column decoder 126 drives all column control signals CC(0)–CC(x) to an un-asserted state (e.g., logic high state). The un-asserted states of CC(0)–CC(x) cause corresponding column write circuits 806(0)–806(x) to pass respective data bits D(0)–D(x) to corresponding columns of main CAM array 104.

If there is a defective column in main CAM array 104, the DCA is programmed into memory element 124, and SPEN is set to an asserted state (e.g., logic high). In response to DCA, spare column select circuit 802 passes the data bit D corresponding to the defective column in main CAM array 104 to spare column 106 via write circuit 804, which is enabled by the asserted state of SPEN. The selected data bit may be written to spare column 106 by driving the spare bit line pair to a state indicated by the selected data bit, as described above with respect to FIGS. 1 and 2. The asserted state of SPEN also enables column decoder 126, which in turn decodes the complemented DCA to assert one of column control signals CC(0)–CC(x). The asserted CC signal causes corresponding write circuit 806 to prevent data from being written to the defective column of main CAM array 104, for example, by driving the defective column's bit line pair to the same predetermined state, while the un-asserted CC signals allow write circuit 806 to pass the corresponding data bits to non-defective columns of main CAM array 104.

For compare operations, steering circuit 800 operates in a similar manner. A comparand word is provided to steering circuit 800 on DBUS as bits D(0)–D(x) (note that DBUS in this example may be the CBUS of FIG. 1). Spare column select circuit 802 routes the comparand bit corresponding to the defective column of main CAM array 104 to spare column 106 via the comparand register and global mask circuit (not shown for simplicity) in response to DCA, and column select circuits 808(0)–808(x) pass the other comparand bits to corresponding non-defective columns of main CAM array 104 in response to the un-asserted CC signals. If there is not a defective column in main CAM array 104, the un-asserted state of SPEN disables column decoder 126, which in turn provides un-asserted CC signals to corresponding global mask cicruits.

For read operations, data bits stored in columns of the addressed row of main CAM array 104 are provided to first inputs of corresponding column select circuits 808(0)–808(x), and the data bit stored in spare column 106 is provided to second inputs of column select circuits 808(0)–808(x). Column select circuits 808(0)–808(x) route either the data bit read out from the corresponding column of main CAM array 104 or the data bit read out from spare column 106 in response to CC(0)–CC(x), respectively. Thus, for each non-defective column, CC is set to an un-asserted state, which causes the corresponding column select circuit 808 to route data read from the non-defective column onto DBUS. Conversely, for each defective column, CC is set to an asserted state, which causes the corresponding column select circuit 808 to route data read from the spare column 106 onto DBUS.

For alternate embodiments, steering circuit 122 may, during write operations, shift the defective and all subsequent (e.g., less significant or right-most) bits of the data word by one bit when steering the data word to read/write circuit 114. For example, if the third column of main CAM array 104 is defective, steering circuit 122 may steer the third data bit to the fourth column of main CAM array 104, steer the fourth data bit to the fifth column of main CAM array 104, and so on, and steer the last data bit to spare column 106. In such alternate embodiments, during read operations, steering circuit 122 re-shifts the same bits by one bit position to the left when outputting the data word to DBUS. Further, in these alternate embodiments, steering circuit 120 steers comparand data to CAM array 102 by shifting the defective bit and all less-significant bits by one bit position to the right.

Figure 9A:
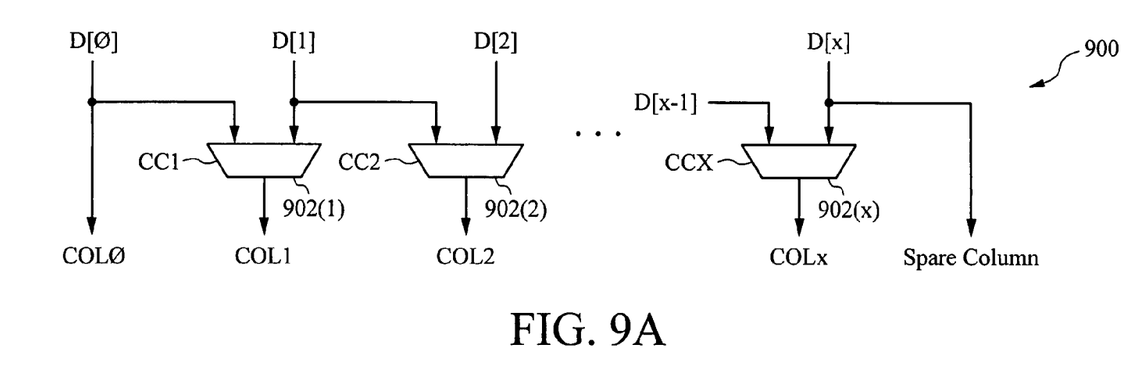
FIGS. 9A and 9B are block diagrams of an alternate embodiment of the steering circuit.

FIG. 9A shows an exemplary circuit configuration 900 for the alternate embodiment of steering circuits 120 and 122 described above that steers data access for a defective column during write and compare operations. Steering circuit 900 includes a plurality of multiplexers (MUXes) 902(1)–902(x), each of which includes inputs to receive a corresponding data bit and a previous data bit, a control terminal to receive a corresponding CC signal, and an output coupled to a corresponding column of the CAM array. Thus, the first (e.g., most significant or left-most) data bit D[0] is provided to the first column (e.g., column 0) of main CAM array 104 and to a first input of MUX 902(1), which includes a second input to receive the second data bit D[1], a control terminal to receive CC(1), and an output coupled to the second column (e.g., column 1) of main CAM array 104. The second data bit D[1] is also provided to a first input of MUX 902(2), which includes a second input to receive the third data bit D[2], a control terminal to receive CC(2), and an output coupled to the third column (e.g., column 2) of main CAM array 104. The last (e.g., least significant or right-most) data bit D[x] is provided to a second input of MUX 902(x) and to the spare column 106. MUX 902(x) includes a first input to receive the second-to-last data bit D[x−1], a control terminal to receive CC(x), and an output coupled to the last column (e.g., column x) of main CAM array 104.

If there is not a defective column in the main CAM array, the CC signals are un-asserted (e.g., to logic low), and each MUX 902 passes the corresponding data bit from its second input to the corresponding column. For example, MUX 902(1) passes D[1] to column 1 in response to an un-asserted CC(1), MUX 902(2) passes D[2] to column 2 in response to an un-asserted CC(2), and so on, where MUX 902(x) passes D[x] to column x in response to an un-asserted CC(x).

If there is a defective column in the main CAM array, steering circuit 900 shifts the defective and all subsequent bits of the data word by one bit when steering the data word to the CAM array. For example, if column 1 is defective, CC(1) and all subsequent CC signals are asserted (e.g., to logic high). Thus, MUX 902(2) steers D[1] to column 2 in response to the asserted CC(2), and so on, where MUX 902(x) steers D[x−1] to column x in response to the asserted CC(x). The spare column is enabled to receive D[x]. Note that for steering circuit 900, the logic state of CC(1), which corresponds to the defective column 1, is a don't care because data steered to the defective column 1 via MUX 902(1) will not effectively participate in compare operations.

Figure 9B:
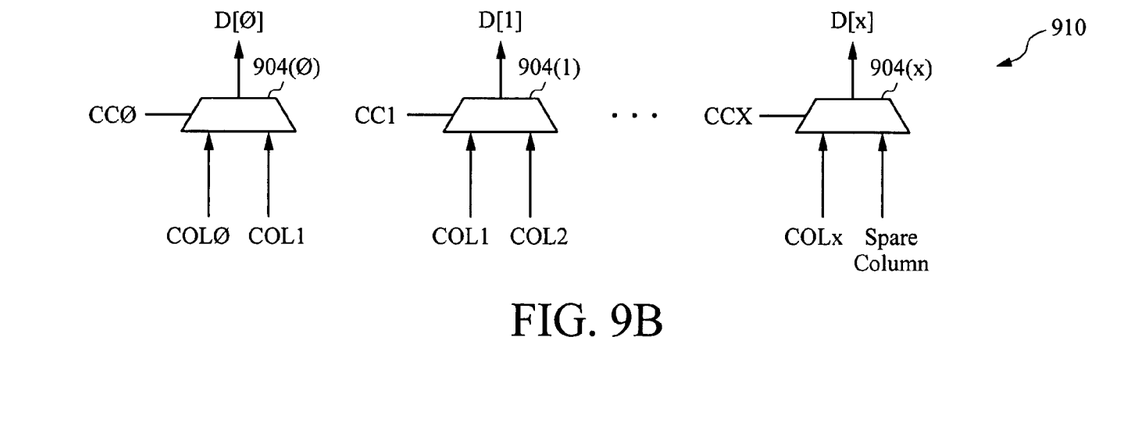

FIG. 9B shows an exemplary circuit configuration 910 for the alternate embodiment of steering circuits 120 and 122 described above that steers data access for a defective column during read operations. Steering circuit 910 includes a plurality of MUXes 904(0)–904(x), each of which includes inputs to coupled to corresponding adjacent columns of CAM array 102, a control terminal to receive a corresponding CC signal, and an output to provide a corresponding data bit. Thus, MUX 904(0) includes inputs coupled to the first and second columns (e.g., columns 0 and 1) of the main CAM array, a control terminal to receive CC(0), and an output to provide the first (e.g., most significant or left-most) data bit D[0]. MUX 904(1) includes inputs coupled to the second and third columns (e.g., columns 1 and 2) of the main CAM array, a control terminal to receive CC(1), and an output to provide the second data bit D[1]. MUX 904(x) includes inputs coupled to the last column (e.g., column x) of the main CAM array and to the spare column, a control terminal to receive CC(x), and an output to provide the last (e.g., least significant or right-most) data bit D[x].

If there is not a defective column in the main CAM array, the CC signals are un-asserted (e.g., to logic low), and each MUX 904 outputs data from the corresponding column. For example, MUX 904(0) outputs data from column 0 as D[0] in response to an un-asserted CC(0), MUX 904(1) outputs data from column 1 as D[1] in response to an un-asserted CC(1), and so on, where MUX 904(1) outputs data from column x as D[x] in response to an un-asserted CC(x).

If there is a defective column in the main CAM array, steering circuit 910 shifts the defective and all subsequent bits of the data word by one bit when reading from the CAM array. For example, if column 1 is defective, CC(0) is un-asserted, and CC(1) and all subsequent CC signals are asserted (e.g., to logic high). Thus, MUX 904(0) steers data from column 0 as D[0] in response to the un-asserted CC(0), MUX 904(1) steers data from column 2 as D[1] in response to the asserted CC(1), and so on, where MUX 904(x) steers data from the spare column as D[x] in response to the asserted CC(x).

The alternate embodiment described above with respect to FIG. 9A does not use a select circuit having inputs to receive all the data bits D[0:x] such as, for example, the select circuit 802 of FIG. 8, and therefore advantageously simplifies signal routing within the steering circuit.

For another embodiment, multiple spare columns may be included. For this example, each MUX 902 in FIG. 9A will receive the input of two previous bits as well as the default bit for its corresponding bit storage in the main CAM array. Additionally, each MUX will receive a second CC signal corresponding to the second spare column. Similarly, MUX 904 in FIG. 9B will receive the input of two subsequent bits as well as the default bit for its corresponding bit storage in the main CAM array.

It is to be noted that for all present embodiments, read and write operations to the defective column need not be disabled because the global mask circuit prevents the defective column from effectively participating in compare operations (e.g., by masking the defective column). Further, column redundancy for CAM devices discussed herein may be combined with CAM row redundancy techniques to further improve yield.

What is claimed is:

1. A method for functionally replacing a defective column of content addressable memory (CAM) cells in a CAM array with a spare column of CAM cells, comprising:

identifying the defective column of CAM cells; and disabling the defective column of CAM cells without including fuses coupled to the defective column.

2. The method of claim 1, further comprising:

enabling the spare column of CAM cells to functionally replace the defective column of CAM cells without including fuses coupled to the spare column.

3. The method of claim 2, wherein each of a plurality of columns of CAM cells in the CAM array is coupled to a bit line pair and to a comparand line pair, and the spare column of CAM cells is coupled to a spare bit line pair and a spare comparand line pair.

4. The method of claim 3, wherein disabling the defective column of CAM cells comprises:

forcing the comparand line pair to the same predetermined state if the corresponding column is identified as defective.

5. The method of claim 3, wherein disabling the defective column of CAM cells and enabling the spare column of CAM cells comprise:

storing, in a global mask circuit associated with the CAM array, one or more mask patterns for compare operations in the CAM array.

6. The method of claim 2, wherein disabling the defective column of CAM cells and enabling the spare column of CAM cells comprises, for each column of CAM cells:

driving the comparand line pair of the column of CAM cells in response to a mask bit, a comparand bit, and a column control signal indicating whether the column of CAM cells is defective.

7. The method of claim 6, wherein driving the comparand line pair comprises:

masking the comparand bit if the column control signal indicates the corresponding column is defective.

8. The method of claim 6, wherein driving the comparand line pair comprises:

latching the column control signal in response to an enable signal;

storing the mask bit; and selectively masking the comparand bit in response to the mask bit and the column control signal.

9. The method of claim 2, wherein disabling the defective column of CAM cells and enabling the spare column of CAM cells further comprises:

driving the spare comparand line pair of the spare column of CAM cells in response to a mask bit, a comparand bit, and a spare column enable signal indicating the existence of the defective column.

10. The method of claim 9, wherein driving the spare comparand line pair comprises:

masking the comparand bit if the spare column enable signal indicates there is not a defective column in the CAM array.

11. The method of claim 9, wherein driving the spare comparand line pair comprises:

latching the spare column enable signal in response to a control signal;

storing the mask bit; and a selectively masking the comparand bit in response to the mask bit and the spare column enable signal.

* * * * *